(12) United States Patent
Subramanian et al.

(10) Patent No.: US 6,946,208 B2
(45) Date of Patent: Sep. 20, 2005

(54) SINTER RESISTANT ABRADABLE THERMAL BARRIER COATING

(75) Inventors: Ramesh Subramanian, Oviedo, FL (US); David B. Allen, Oviedo, FL (US)

(73) Assignee: Siemens Westinghouse Power Corporation, Orlando, FL (US)

(*) Notice: Subject to any disclaimer, the term of this patent is extended or adjusted under 35 U.S.C. 154(b) by 0 days.

(21) Appl. No.: 10/454,802

(22) Filed: Jun. 4, 2003

(65) Prior Publication Data

US 2003/0211354 A1 Nov. 13, 2003

Related U.S. Application Data

(63) Continuation-in-part of application No. 10/010,676, filed on Dec. 6, 2001, which is a continuation-in-part of application No. 10/144,111, filed on May 13, 2002, now Pat. No. 6,835,465.

(51) Int. Cl.[7] .................................................. B32B 9/00
(52) U.S. Cl. ........................ 428/701; 702/697; 702/699; 702/304.4
(58) Field of Search .............................. 428/304.4, 655, 428/632, 633, 679, 680, 701, 702, 697, 699; 416/241 B; 501/103, 126, 134

(56) References Cited

U.S. PATENT DOCUMENTS

| 4,153,469 A | 5/1979 | Alexandrov et al. |
| 4,507,394 A | 3/1985 | Mase et al. |
| 4,535,033 A | 8/1985 | Stecura |
| 4,656,145 A | 4/1987 | Soroi |
| 4,735,666 A | 4/1988 | Mase et al. |
| 4,931,214 A | 6/1990 | Worrell |
| 4,936,745 A | 6/1990 | Vine et al. |
| 5,151,201 A | 9/1992 | Fishler et al. |
| 5,177,040 A | 1/1993 | Tamamaki et al. |
| 5,434,210 A | 7/1995 | Rangaswamy et al. |
| 5,789,330 A * | 8/1998 | Kondo et al. ................ 501/103 |
| 6,025,078 A | 2/2000 | Rickerby et al. |

(Continued)

FOREIGN PATENT DOCUMENTS

| EP | 0 765 951 A2 | 4/1997 |
| EP | 1 055 743 A1 | 11/2000 |
| EP | 1 318 215 A2 | 6/2003 |

OTHER PUBLICATIONS

Kazuo Shinozaki, Hongrong Sun, Keizo Uematsu, Nobuyasu Mizutani, and Masanori Kato. Sintering $Sm_2O_3$—$ZrO_2$ Solid Solution. *The Chemical Society of Japan*, 1981, (9), pp. 1454–1461.

Primary Examiner—Jennifer McNeil

(57) ABSTRACT

An abradable thermal barrier coating material (10) formed of a highly defective fluorite ceramic matrix (16) having a desired degree of porosity (18) created in part by the addition of a fugitive material (19). The ceramic material has a concentration of a stabilizer sufficiently high that the oxygen vacancies created by the stabilizer interact within the matrix to form multi-vacancies, thereby improving the sintering resistance of the material. Such a concentration of stabilizer results in a material that is softer than prior art materials having lower concentrations of stabilizer, and that will be more resistive to sintering than prior art materials. Embodiments include a fluorite matrix of zirconia stabilized by at least 30 wt. % yttria, or stabilized by at least 30 wt. % ytterbia, and with porosity of 10–40%. In one embodiment, a metallic gas turbine seal ring segment is coated with a bond coat layer, then with a layer of porous 8 wt. % YSZ material, and finally with a layer of 33 mole % YbSZ (61.3 wt. % YbSZ) material having porosity of 10–40%.

5 Claims, 1 Drawing Sheet

U.S. PATENT DOCUMENTS

| | | |
|---|---|---|
| 6,042,898 A | 3/2000 | Burns et al. |
| 6,117,560 A | 9/2000 | Maloney |
| 6,123,997 A | 9/2000 | Schaeffer et al. |
| 6,177,200 B1 | 1/2001 | Maloney |
| 6,187,453 B1 | 2/2001 | Maloney |
| 6,190,124 B1 | 2/2001 | Freling et al. |
| 6,203,927 B1 | 3/2001 | Subramanian et al. |
| 6,231,998 B1 | 5/2001 | Bowker et al. |
| 6,258,467 B1 | 7/2001 | Subramanian |
| 6,294,260 B1 | 9/2001 | Subramanian |
| 6,296,945 B1 | 10/2001 | Subramanian |
| 2002/0172837 A1 | 11/2002 | Allen et al. |

\* cited by examiner

SINTER RESISTANT ABRADABLE THERMAL BARRIER COATING

This application is a continuation-in-part of co-pending U.S. application Ser. No. 10/010,676 filed on Dec. 6, 2001. This application is also a continuation-in-part of U.S. application Ser. No. 10/144,111 filed on May 13, 2002, now U.S. Pat. No. 6,835,465 and published on Nov. 21, 2002, as publication number US 2002/0172837 A1.

FIELD OF THE INVENTION

This invention relates generally to the field of thermal barrier coatings and particularly to a ceramic thermal barrier coating that may be used as an abradable coating for a metal substrate in a very high temperature application such as on the ring segment of a gas turbine engine.

BACKGROUND OF THE INVENTION

The demand for continued improvement in the efficiency of gas turbine engines has driven the designers of such machines to specify increasingly higher firing temperatures. Nickel and cobalt based superalloys are now commonly used to form components in the combustion gas flow path because of their resistance to the high temperature oxidizing environment. However, even modern superalloys are not capable of surviving long term operation at the firing temperatures of modern gas turbine engines that may exceed 1,400° C. In order to provide additional protection to the metal components in the hottest areas of a gas turbine engine, it is known to coat the metal substrate with a layer of ceramic material to thermally insulate and chemically isolate the substrate from the hot combustion gasses. A widely used material for this application is yttria stabilized zirconia (YSZ), with 8 wt. % $Y_2O_3$ (8YSZ) being a common composition.

The thermal insulating properties of ceramic thermal barrier coatings have been the subjects of many design improvements over the years. U.S. Pat. No. 6,025,078 describes the use of zirconia stabilized with both yttria and erbia. The erbia reduces the thermal conductivity of the material when compared to zirconia stabilized by yttria alone. This patent suggests that the material may include between 4–20 wt. % yttria, while it may include between 5–25 wt. % erbia. Specific embodiments are described as having as much as 29 wt. % combined yttria and erbia stabilizer.

It is also important for a ceramic thermal barrier coating to exhibit phase stability over the expected operating range of operating temperatures. A change in phase may be accompanied by a change in volume, leading to the development of stresses within the coating and between the coating and the substrate. A thermal barrier coating having high phase stability is described in U.S. Pat. No. 6,258,467 as having a pyrochlore crystal structure. The pyrochlore structure is described as having several advantages over a conventional fluorite (cubic) structure, including a higher resistance to sintering. The patent teaches that the oxygen defects in a conventional fluorite yttria stabilized zirconia (YSZ) structure are very mobile and can contribute to sintering, whereas in the pyrochlore structure the oxygen defects are ordered and, hence, can be more resistant to sintering. Another pyrochlore material, lanthanum zirconate, is described in U.S. Pat. No. 6,117,560.

U.S. Pat. No. 4,535,033 describes a thermal barrier coating of zirconia partially stabilized with ytterbia. That patent describes a preferred embodiment having 12.4 wt. % ytterbia and including the cubic, monoclinic and tetragonal phases. This patent illustrates that the number of thermal cycles to failure decreases for this material with an increasing stabilizer content, with data supporting this trend being plotted up to about 25 wt. % ytterbia.

U.S. Pat. No. 6,187,453 describes how a coating formed by an EB-PVD process may not have a composition corresponding to the target material used to form the coating. The patent discloses a process for forming a thermal barrier coating material being a homogeneous mixture of yttria and ceria having 5–60 wt. % yttria with the balance being ceria. This patent also teaches that an increased amount of yttria in ceria will enhance the erosion resistance of the material. In contrast, the patent notes that zirconia stabilized with 20 wt. % yttria demonstrates a dramatically increased rate of erosion when compared to YSZ having only 12 wt. % yttria.

U.S. Pat. No. 6,231,998 discloses hexagonal phase zirconium scandate with up to 42 wt. % $Sc_2O_3$. That patent suggests that this material will be more resistant to sintering than YSZ because oxygen vacancies in the crystal structure of YSZ promote diffusion of species through the structure, thereby resulting in relatively easy sintering of the YSZ.

U.S. Pat. No. 4,936,745 discloses an abradable ceramic seal material made of zirconia stabilized with 6–8% yttria (6–8YSZ) and having porosity of 20–30%. This abradable material is prepared by co-spraying a mixture of ceramic powder and a fugitive material such as polyester. The polyester is volatized during heat treatment of the YSZ material, thereby leaving voids that provide a desired degree of porosity for applications where the material must be abraded by a rotating component. This material has been used to coat the seal rings of combustion turbines to provide an abradable seal with the adjacent rotating turbine blade tips. However, operational experience with this material has been less than desirable as the firing temperatures of combustion turbines continue to increase above 1,100° C.

There is an ongoing need for thermal barrier coating materials having improved performance properties in high temperature, corrosive environment applications. In particular, there is a need for an abradable coating that may be used for turbine ring segment applications in modern combustion turbines.

SUMMARY OF THE INVENTION

An abradable material is described herein as including: a layer of $ZrO_2$ stabilized by a concentration of one of $Y_2O_3$ and $Yb_2O_3$ greater than that concentration of the one of $Y_2O_3$ and $Yb_2O_3$ that would result in a peak ionic conductivity in the layer; and porosity in the layer of 10–40% by volume.

An abradable material is described herein as including: a layer of $ZrO_2$ stabilized by a concentration of one of $Y_2O_3$ and $Yb_2O_3$ greater than that concentration of the one of $Y_2O_3$ and $Yb_2O_3$ that would result in a peak free vacancy concentration in the layer; and porosity in the layer of 10–40% by volume.

An abradable material during a stage of manufacture is described herein as including: a layer of $ZrO_2$ stabilized by a concentration of one of $Y_2O_3$ and $Yb_2O_3$ greater than that concentration of the one of $Y_2O_3$ and $Yb_2O_3$ that would result in a peak ionic conductivity in the layer; and particles of a fugitive material disposed in the layer.

An abradable component for use in a high temperature environment is described herein as including: a metallic substrate; a bond coat layer disposed over the substrate; a first layer of zirconia disposed over the bond coat layer and stabilized by one of yttria and yyterbia having a concentration of less than that required to achieve a peak ionic conductivity in the first layer; and a second layer of zirconia disposed over the first layer and stabilized by one of yttria and yyterbia having a concentration of greater than that required to achieve a peak ionic conductivity in the second layer.

BRIEF DESCRIPTION OF THE DRAWINGS

These and other advantages of the invention will be more apparent from the following description in view of the drawings that show.

DETAILED DESCRIPTION OF THE INVENTION

Figure 1:
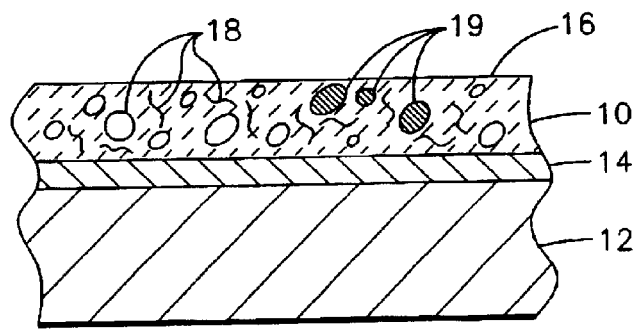
FIG. 1 is a partial cross-sectional view of a gas turbine component having a metallic substrate covered by an abradable ceramic material.

An improved abradable thermal barrier coating material 10 is illustrated in FIG. 1 as being disposed on a substrate material 12. This abradable coating may be used on a combustion turbine ring segment or other component that must exhibit high temperature stability and good abradability. The substrate may be one of the high temperature resistant nickel or cobalt based superalloy materials known in the art. A layer of bond coat material 14 may be disposed between the thermal barrier coating material 10 and the substrate material 12. Known bond coat materials include nickel aluminide, cobalt aluminide, platinum aluminide, and the commonly used MCrAlY alloys. An oxide layer (not shown) may be grown on the bond coat material 14 prior to the deposition of the thermal barrier coating material 10. The bond coat material 14 may be deposited by any method known in the art, such as APS, EB-PVD, sputtering, etc.

The thermal barrier coating 10 includes a ceramic material 16 containing a plurality of voids 18 that provide the coating 10 with a desired degree of porosity. The voids 18 may include generally spherical or other shaped pores, generally horizontal cracks or defects, and generally vertical cracks or defects. The generally horizontal and generally vertical cracks or defects may be those generated in the material by differential thermal expansion during the deposition process. The pores may be created by the volatilization of a fugitive material 19 that is intentionally added to the ceramic material 16 during a thermal spray deposition process. A typical fugitive material is polyester, although other compatible materials that volatize during subsequent heat treatment or operational use of the material may be used. FIG. 1 illustrates both particles of fugitive material 19 and the pores 18 that result when the fugitive material 19 has volatized. The fugitive material may be mixed with the ceramic powder before spraying or it may be introduced separately into the hot spray flow. The fugitive material may be 1–5 wt. % of the coating powder mixture and may have a nominal particle size of 45–125 microns. The resulting coating 10 may have a total porosity of 10–40% for example. Percentages quoted herein for porosity are volume percentages. The individual concentrations for the various types of voids could range as follows: from 5–40% or preferably 20–30% pores; from 5–30% or preferably 5–10% horizontal cracks; and 1–20% or preferably 1–5% vertical cracks. Typical dimensions of each of the types of voids may be as follows: pores of 10–200 microns or preferably 25–125 microns in diameter; horizontal cracks of 25–100 microns long and 1–5 microns long or preferably 25–50 microns long and 1–2 microns wide; and vertical cracks of 25–100 microns long and 1–5 microns long or preferably 25–50 microns long and 1–2 microns wide.

In one embodiment, the coating ceramic material 16 is a ytttria-stabilized zirconia containing at least 30 wt. % $Y_2O_3$ (30YSZ) and having a fluorite structure. Other embodiments include a ytttria stabilized zirconia containing at least 40 wt. % $Y_2O_3$. In still another embodiment, a ytttria stabilized zirconia contains at least 50 wt. % $Y_2O_3$ with a fluorite structure. Thermal barrier coating material 10 may further be a fluorite matrix structure of zirconia stabilized by a concentration of ytterbia of at least 30 wt. % $Yb_2O_3$ (30YbSZ), or at least 40 wt. % $Yb_2O_3$, or at least 50 wt. % $Yb_2O_3$. One embodiment is ytterbia stabilized zirconia with 61.3 wt. % ytterbia. Concentrations of stabilizer of up to about 50 mole % are believed to be useful in such fluorite matrix materials for abradable thermal barrier coating applications. Weight percent numbers are often discussed rather than mole percent because of the practical implications of mixing materials by weight. Other embodiments include 33 mole % (47.4 wt. %) YSZ and 33 mole % (61.3 wt. %) YbSZ.

Figure 2:
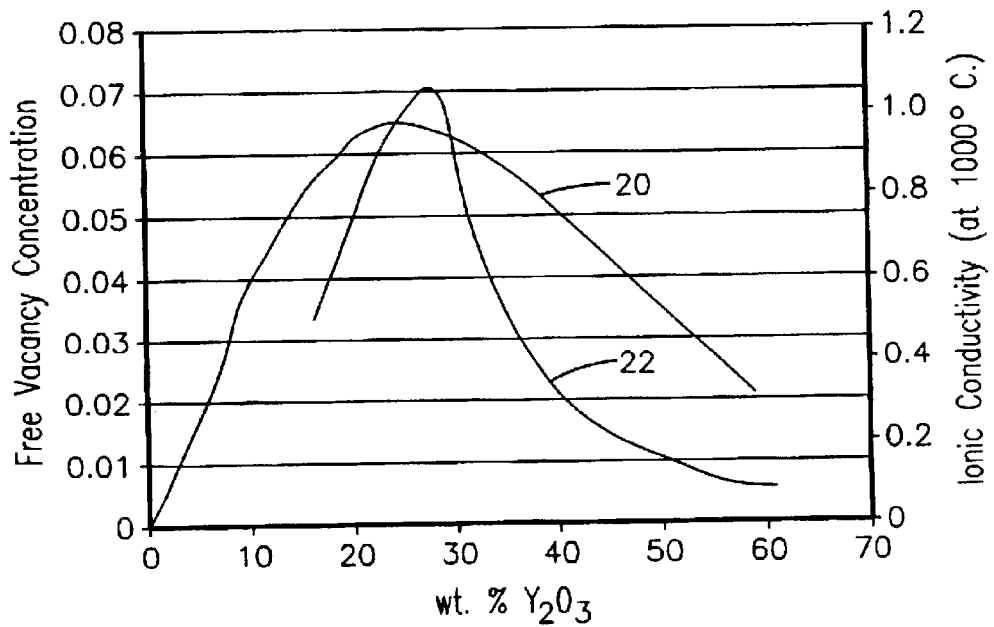
FIG. 2 is a graph illustrating the free vacancy concentration and the ionic conductivity of yttria stabilized zirconia as a function of the concentration of yttria.

FIG. 2 illustrates material properties related to the performance of these materials as ceramic thermal barrier coating materials. Curve 20 is the free vacancy concentration in a YSZ material as a function of the wt. % of yttria stabilizer ($Y_2O_3$), and curve 22 is the ionic conductivity of the material as a function of the wt. % of yttria stabilizer. Note that the above-described embodiments each include a concentration of yttria stabilizer that is greater than that concentration of $Y_2O_3$ that would result in a peak ionic conductivity in the matrix, and that is greater than that concentration of $Y_2O_3$ that would result in a peak free vacancy concentration in the matrix. The applicants have discovered that a fluorite YSZ thermal barrier coating material having such an unusually high concentration of stabilizer will demonstrate a resistance to sintering that is significantly better than the prior art 8YSZ material. The resistance to sintering measured as linear shrinkage for 50 wt. % yttria stabilized zirconium has been measured using a high temperature dilatometer to be less than 4000 ppm after exposure to 1400° C. for 24 hours. The percentage shrinkage of prior art air plasma sprayed 8 wt. % YSZ coating after 24 hours at 1,400° C. is a factor of 4 higher than that of the air plasma sprayed 50 wt. % YSZ of the present invention.

The presence of molecules of a stabilizer material within a ceramic matrix structure will result in an increase in the formation of oxygen vacancies within the matrix. It is taught in the prior art that this increase in oxygen vacancies will compromise the sintering resistance of the material, since the vacancies facilitate the diffusion of species throughout the matrix. However, the applicant has noted that this adverse trend will reverse when the composition exceeds a value above which the vacancies start to interact to form multi-vacancies. The multi-vacancies are larger than the individual vacancies and are much less mobile in the matrix material. Thus, the diffusion coefficients will decrease and the sintering resistance of the material will improve. The multi-vacancies may be di-vacancies, i.e. the combination of two vacancies, or other forms of multi-vacancies.

The concentration of $Yb_2O_3$ in YbSZ material of the present invention is greater than the concentration of $Yb_2O_3$ that would result in a peak ionic conductivity in the matrix, and is greater than the concentration of $Yb_2O_3$ that would result in a peak free vacancy concentration in the matrix. Interestingly, the thermal cyclic life data published in U.S. Pat. No. 4,535,033 are limited to only those concentrations of ytterbia that approach but do not exceed the peak free vacancy and peak ionic conductivity values. Thus, a linear extrapolation of the data of the '033 patent would lead to the erroneous conclusion that higher concentrations of stabilizer would be even less desirable, thus teaching away from the present invention. To the contrary, the applicants have found that a useful abradable thermal barrier coating may be formed as a highly defective fluorite matrix structure of ceramic oxide material wherein the concentration of stabilizer is sufficiently high to create a quantity of multi-vacancy defect clusters in the matrix structure. Such a material can exhibit an increased resistance to sintering when compared to the same matrix material stabilized by a more traditional concentration of such stabilizer, for example 7–12 wt. % of stabilizer.

The present inventors have found that the degraded performance of prior art abradable 8YSZ materials in very high temperature blade ring segment applications is at least in part due to the increasing density of the coating material over time caused by sintering. As the abradable material sinters and becomes more dense, its abradability decreases and the coincident wear on the opposed blade tip surface increases. The improved sintering resistance of the present invention compared to prior art abradable materials provides extended abradability over time in very high temperature applications such as the temperatures of 1,100–1,400° C. that may be experienced in a modern gas turbine engines.

A Volume Wear Ratio (VWR) may be calculated to compare the performance of various abradable materials under similar wear conditions. The VWR for a blade tip seal application is defined as the volume of material worn off of an abradable seal divided by the volume of material worn off of the associated rubbing blade tip. A high value for VWR is desirable because a high value indicates that the blade tip wear is minimized. Samples of prior art 8YSZ abradable material with 4 wt. % polyester added for porosity have been tested in both the as-sprayed condition and after being sintered for 100 hours at 1200° C. The abradable material was worn against a silicon carbon blade tip, with the silicon carbon being aged for wear against the sintered abradable material. For comparison, samples of 61.3 wt. % YbSZ (33 mole %) abradable material with 4 wt. % polyester added for porosity were similarly tested in the as-sprayed condition and after being sintered for 100 hours at 1200° C. Spray parameters were controlled in each of these tests to provide similar porosity values in the as-sprayed material. Volume Wear Ratios were calculated for these materials as follows:

| MATERIAL (wt. %) | VOLUME WEAR RATIO (higher is better) |
| --- | --- |
| 8YSZ as-sprayed (prior art) | 62 |
| 8YSZ sintered (prior art) | 5 |
| 61.3YbSZ as-sprayed | 137 |
| 61.3YbSZ sintered | 91 |

These tests are informative in that they demonstrate that the abradable material of the present invention may retain its abradability property somewhat better than does prior art 8YSZ material after it has been exposed to this sintering temperature. Another test showed that a 47.4 wt. % YSZ (33 mole %) abradable material with 4 wt. % polyester added to achieve a similar degree of porosity exhibited a VWR of 98 in its as-sprayed condition. Thus, the VWR of the 47.4YSZ material was found to be higher than that of the 8YSZ in its as-sprayed condition. This is thought to be due to the fact that the 47.4YSZ material is softer than the prior art 8YSZ. Softer material may be prone to a higher rate of erosion in applications where erosion is a primary concern. However, for gas turbine engines used for land-based power generation applications, erosion is of a reduced concern due to the use of filters in the intake air path, and sintering is the primary concern due to the need for extended operation at full power (highest temperature) conditions. The material of the present invention provides improved performance in such an abrading environment due to being softer and due to exhibiting less sintering than prior art 8YSZ material. There may be a practical upper limit to the amount of stabilizer used due to the fact that the material becomes softer as the concentration increases. Although the present inventors have determined no particular upper limit for either YSZ or YbSZ, it is believed that up to 50 mole % stabilizer may be useful in some applications.

Figure 3:
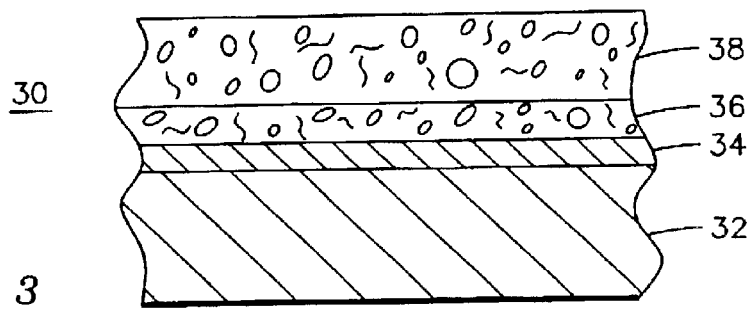
FIG. 3. is a partial cross-sectional view of a gas turbine component having a metallic substrate covered by an abradable ceramic material having two distinct layers.

FIG. 3 illustrates another embodiment of the invention wherein a combustion turbine blade ring seal segment 30 is shown in partial cross-sectional view as including a metallic substrate 32, a bond coat layer 34, a layer 36 of zirconia stabilized by 4–9 wt. % yttria or ytterbia and containing a desired degree of porosity, and a layer 38 of zirconia stabilized by a higher concentration of stabilizer and containing a desired degree of porosity created by a fugitive material, as described above. The concentration of stabilizer in layer 38 may be greater than the concentration that would create the peak free vacancy concentration or the peak ionic conductivity in the material. This is not the case in layer 36 where the concentration is more typical of the prior art and is less than that required to achieve peak free vacancy concentration or peak ionic conductivity. The concentration of stabilizer in layer 38 may be at least 30 or at least 50 wt. % of either yttria or yyterbia, as described above with respect to layer 10 of FIG. 1. Layer 36 is somewhat more resistant to fracture than layer 38 and it can improve the strain tolerance of the component 30 and thus help to minimize spalling of layer 38. In other embodiments, layer 36 may comprise multiple layers of material having differing properties, such as having a lower porosity in a lower layer proximate the bond coat layer 34 and having a higher porosity in an upper layer proximate layer 38.

The thermal spray parameters used to deposit layer 10 of FIG. 1 or layer 38 of FIG. 3 with optimized porosity as described above are necessarily different than those used to deposit layer 36 or those used to deposit prior art abradable coatings. The melting points and the specific heats of the compositions of the present invention are lower than those of 8YSZ. Consequently the spray gun voltage and current, and therefore the spray gun power, are significantly lower than those used for an 8YSZ layer. This necessitates a change in the powder feed rate and also powder carrier gas velocity to maintain the powder flow in the center of the plasma plume. Specific spray parameters will vary depending upon the type of spray gun selected. For the YbSZ test specimen described above as providing a Volume Wear Ratio of 137, a Sulzer Metco F4 gun was used within the following operating parameter ranges: current of 500–600 amps; system voltage of 60–70 volts, 400–500 mm/sec traverse speed; carrier flow 20–30 psi; standoff 5–6 inches; and argon pressure 20–30 psi.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. An abradable material comprising:
   a layer of $ZrO_2$ stabilized by a concentration of $Yb_2O_3$ greater than that concentration of $Yb_2O_3$ that would result in a peak ionic conductivity in the layer;
   porosity in the layer of 10–40% by volume; and
   further comprising a concentration of at least 50 wt. % $Yb_2O_3$ in the layer.

2. An abradable material during a stage of manufacture comprising:
   a layer of $ZrO_2$ stabilized by a concentration of one of $Y_2O_3$ and $Yb_2O_3$ greater than that concentration of the one of $Y_2O_3$ and $Yb_2O_3$ that would result in a peak ionic conductivity in the layer;
   particles of a fugitive material disposed in the layer; and
   further comprising a concentration of at least 50 wt. % of the one of $Y_2O_3$ and $Yb_2O_3$ in the layer.

3. An abradable material comprising:
   a layer of $ZrO_2$ stabilized by a concentration of $Y_2O_3$ greater than that concentration of $Y_2O_3$ that would result in a peak ionic conductivity in the layer;
   porosity in the layer of 10–40% by volume; and
   further comprising a concentration of at least 50 wt. % $Y_2O_3$ in the layer.

4. An abradable material comprising:
   a layer of $ZrO_2$ stabilized by a concentration of at least 33 mole % $Yb_2O_3$; and
   porosity in the layer of 10–40% by volume.

5. An abradable material comprising:
   a layer of $ZrO_2$ stabilized by a concentration of at least 33 mole % $Y_2O_3$; and
   porosity in the layer of 10–40% by volume.

* * * * *